US012566224B2

(12) United States Patent
Bae et al.

(10) Patent No.: US 12,566,224 B2
(45) Date of Patent: Mar. 3, 2026

(54) VAPOR CELL AND VAPOR CELL TEMPERATURE CONTROL SYSTEM

(71) Applicant: KOREA RESEARCH INSTITUTE OF STANDARDS AND SCIENCE, Daejeon (KR)

(72) Inventors: In Ho Bae, Daejeon (KR); Seong Chong Park, Daejeon (KR); Jae Keun Yoo, Daejeon (KR); Seon Do Lim, Daejeon (KR); Young Pyo Hong, Sejong-si (KR); No Weon Kang, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 131 days.

(21) Appl. No.: 18/684,777

(22) PCT Filed: Nov. 8, 2021

(86) PCT No.: PCT/KR2021/016146
§ 371 (c)(1),
(2) Date: Feb. 19, 2024

(87) PCT Pub. No.: WO2023/074981
PCT Pub. Date: May 4, 2023

(65) Prior Publication Data
US 2024/0426950 A1     Dec. 26, 2024

(30) Foreign Application Priority Data

Oct. 28, 2021    (KR) ......................... 10-2021-0145433

(51) Int. Cl.
*G01R 33/00*        (2006.01)
*G01R 33/26*        (2006.01)

(52) U.S. Cl.
CPC ......... *G01R 33/0082* (2013.01); *G01R 33/26* (2013.01)

(58) Field of Classification Search
CPC ...... G01R 33/0082; G01R 33/26; G01K 1/02; G02B 27/30; G21K 1/087; H01S 3/067
(Continued)

(56) References Cited

U.S. PATENT DOCUMENTS 10,545,461 B1    1/2020  Roper et al.
10,739,416 B2 *  8/2020  Nagasaka ............ G01R 33/032
(Continued)

FOREIGN PATENT DOCUMENTS

JP        2017183313 A  * 10/2017  ............. H03B 17/00
JP          202122891 A    2/2021
(Continued)

OTHER PUBLICATIONS

Translation of JP-2017 183313 (Year: 2017).*
International Search Report issued in PCT Application No. PCT/KR2021/016146, mailed on Jul. 25, 2022.

*Primary Examiner* — Christopher P Mcandrew
(74) *Attorney, Agent, or Firm* — DILWORTH IP, LLC

(57)        ABSTRACT

The present disclosure relates to a vapor cell and a vapor cell temperature control system, and more specifically, to a vapor cell and a vapor cell temperature control system which use a laser to control the temperature of the vapor cell without distortion of an electromagnetic field. The vapor cell according to an embodiment of the present disclosure may include a body provided with a penetration part, which is a space in which a reactive material is accommodated, and a black material provided on a part of an outer surface of the body. According to an embodiment of the present disclosure, there is an advantage in that the intensity and phase of electromagnetic waves in the micromagnetic field and millimeter wave band can be measured by minimizing distortion and (Continued)

removing noise caused by a temperature control device when measuring electromagnetic fields using an atomic system.

10 Claims, 4 Drawing Sheets

(58) Field of Classification Search
    USPC .......................................................... 324/305
    See application file for complete search history.

(56)                   References Cited

U.S. PATENT DOCUMENTS

| | | | | |
|---|---|---|---|---|
| 2021/0041513 A1* | 2/2021 | Mohseni | .............. | G01R 33/032 |
| 2021/0063510 A1* | 3/2021 | Ledbetter | ........... | G01R 33/0017 |
| 2021/0239772 A1* | 8/2021 | Ledbetter | ............. | G01N 24/006 |
| 2022/0179017 A1* | 6/2022 | Lee | ........................ | G01R 33/26 |
| 2022/0214411 A1* | 7/2022 | Butters | ................ | G01R 33/032 |
| 2022/0397618 A1* | 12/2022 | Ledbetter | .............. | G01R 33/26 |

FOREIGN PATENT DOCUMENTS

| | | | |
|---|---|---|---|
| KR | 1020170014602 | A | 2/2017 |
| KR | 102022003 | B1 | 9/2019 |
| KR | 1020190134088 | | 12/2019 |
| KR | 1020200128655 | A | 11/2020 |
| KR | 102254828 | B1 | 5/2021 |
| KR | 10202100120047 | A | 10/2021 |

* cited by examiner

10

20

100

10

20

(a)

20

100

10

(b)

20

20

100

1

VAPOR CELL AND VAPOR CELL TEMPERATURE CONTROL SYSTEM

TECHNICAL FIELD

The present disclosure relates to a vapor cell and a vapor cell temperature control system, and more specifically, to a vapor cell and a vapor cell temperature control system which use a laser to control the temperature of the vapor cell without distortion of an electromagnetic field.

BACKGROUND ART

In electromagnetic wave measurement technology, especially electromagnetic wave measurement technology using an atomic system, the accuracy of electromagnetic wave measurement is closely related to the density of atoms in the vapor cell. Conventional electromagnetic wave measurement technologies using an atomic system have mainly used a method of increasing the density of atoms by raising the temperature of the vapor cell, thereby obtaining strong signal intensity.

A contact-type temperature control device has been mainly used as a device for controlling the temperature of the vapor cell. In the case of the contact-type temperature control device, since the heating element (e.g., coil) surrounds the vapor cell and controls the temperature, the electromagnetic field noise generated by the contact-type temperature control device itself and the electromagnetic field noise generated by the heating element cause distortion of an electromagnetic field to be measured.

In other words, difficulties arise in signal processing due to the noise and distortion generated from the contact-type temperature control device.

In order to minimize the influence of the magnetic field caused by the vapor cell temperature control device, Korean Patent No. 10-2022003 entitled "MAGNETIC FIELD COIL AND HEATER SYSTEM" discloses a method of opposing the directions of the coils. However, because the dielectric constant of an electromagnetic wave as a measurement object is different from that of air, the distortion of the electromagnetic wave as a measurement object occurs still.

Methods using coils or high-temperature liquids have been widely used to increase the density of atoms in a vapor cell, but recently, with the realization of electromagnetic wave measurement technology using atomic vapor cells, there is a need for the development of technology that can increase the density of atoms in a vapor cell without electromagnetic wave distortion.

DISCLOSURE

Technical Problem

The present disclosure has been conceived in view of the above-described drawbacks, and the purpose of the present disclosure is to provide a vapor cell including a black material and a non-contact vapor cell temperature control system using laser light.

Technical Solution

As an embodiment of the present disclosure, a vapor cell is provided.

The vapor cell according to an embodiment of the present disclosure may include a body provided with a penetration part, which is a space in which a reactive material is accommodated, and a black material provided on a part of an outer surface of the body.

The vapor cell according to another embodiment of the present disclosure may include a body provided with a penetration part, which is a space in which a reactive material is accommodated, and a window which surrounds a part or all of the body with a part of an outer surface of the window coated with a black material.

In the vapor cell according to any one embodiment of the present disclosure, the black material may include Vanta (Vertically Aligned Nano Tube Array) Black or Carbon Black.

In the vapor cell according to any one embodiment of the present disclosure, the body may be a 2n (n is an integer of 2 or more) prism or cylinder.

As an embodiment of the present disclosure, a vapor cell temperature control system is provided.

The vapor cell temperature control system according to an embodiment of the present disclosure may include the above-described vapor cell, a light irradiation part which irradiates laser light to the vapor cell, a non-contact thermometer which measures the temperature of the vapor cell, and a control part configured to be capable of measuring the temperature of the vapor cell with the non-contact thermometer, and of providing a feedback to the light irradiation part when the temperature of the vapor cell reaches a preset temperature.

The vapor cell temperature control system according to an embodiment of the present disclosure may further include a support which supports the vapor cell.

In the vapor cell temperature control system according to an embodiment of the present disclosure, the support may be provided with a hollow passage formed along its longitudinal direction and functions as a heat sink.

The vapor cell temperature control system according to an embodiment of the present disclosure may further include a collimator which converts the laser light to be incident on the vapor cell into parallel light.

Advantageous Effects

According to an embodiment of the present disclosure, there is an advantage in that the intensity and phase of electromagnetic waves in the micromagnetic field and millimeter wave band can be measured by minimizing distortion and removing noise caused by a temperature control device when measuring electromagnetic fields using an atomic system.

In addition, it can be used as a replacement for the existing contact-type temperature control system in atom-based quantum systems, such as quantum memory using an atomic system and four-photon mixed light source generation, as well as atomic system-based electromagnetic field measurement systems.

Also, it has the advantage of being able to provide an accurate temperature control system across industries that require a non-contact temperature control system.

Advantageous effects which can be obtained from the present disclosure are not limited to the aforementioned ones, and other advantageous effects not mentioned above can be understood from the following detailed description by a person having ordinary skill in the art to which the disclosure belongs.

BEST MODE FOR INVENTION

Figure 1:
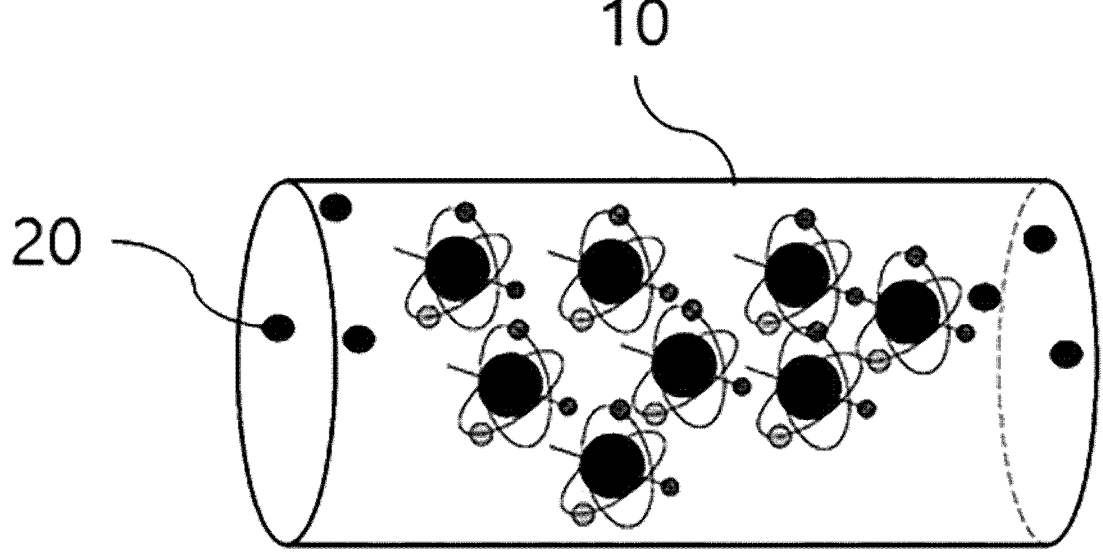
FIG. 1 is an exemplary diagram of a vapor cell according to the present disclosure.

As an embodiment of the present disclosure, a vapor cell is provided.

The vapor cell according to an embodiment of the present disclosure may include a body provided with a penetration part, which is a space in which a reactive material is accommodated, and a black material provided on a part of an outer surface of the body.

The vapor cell according to another embodiment of the present disclosure may include a body provided with a penetration part, which is a space in which a reactive material is accommodated, and a window which surrounds a part or all of the body with a part of an outer surface of the window coated with a black material.

In the vapor cell according to any one embodiment of the present disclosure, the black material may include Vanta (Vertically Aligned Nano Tube Array) Black or Carbon Black.

In the vapor cell according to any one embodiment of the present disclosure, the body may be a 2n (n is an integer of 2 or more) prism or cylinder.

As an embodiment of the present disclosure, a vapor cell temperature control system is provided.

The vapor cell temperature control system according to an embodiment of the present disclosure may include the above-described vapor cell, a light irradiation part which irradiates laser light to the vapor cell, a non-contact thermometer which measures the temperature of the vapor cell, and a control part configured to be capable of measuring the temperature of the vapor cell with the non-contact thermometer, and of providing a feedback to the light irradiation part when the temperature of the vapor cell reaches a preset temperature.

The vapor cell temperature control system according to an embodiment of the present disclosure may further include a support which supports the vapor cell.

In the vapor cell temperature control system according to an embodiment of the present disclosure, the support may be provided with a hollow passage formed along its longitudinal direction and functions as a heat sink.

The vapor cell temperature control system according to an embodiment of the present disclosure may further include a collimator which converts the laser light to be incident on the vapor cell into parallel light.

Mode for Invention

Hereinafter, embodiments of the present disclosure will be described in detail with reference to the accompanying drawings such that those of ordinary skill in the art can easily practice them. However, the disclosure can be embodied in various different forms, and the scope of the disclosure should not be construed as being limited to the embodiments described herein. In the drawings, in order to describe clearly the disclosure, parts not related to the description are omitted, and like reference signs will be given to like constitutional elements throughout the specification.

The terms used in this specification will be briefly explained, and then the present disclosure will be described in detail.

The terms used in the present disclosure have been selected from among general terms currently widely used as many as possible while considering their functions in the present disclosure, but this may vary depending on the intentions of engineers working in the art, precedents, the emergence of new technologies, or the like. In addition, in certain cases, there are terms arbitrarily selected by the applicant, and in this case, their meanings will be described in detail in the description of the relevant disclosure. Therefore, the term used in the disclosure should be defined based on not a simple term name but the meaning of the term and the entire contents of the disclosure.

Throughout this specification, when a part "includes" or "comprises" a component, it means not that the part excludes other component, but instead that the part may further include other component unless explicitly stated to the contrary. In addition, terms such as " . . . part" and " . . . module" described in the specification mean a part that processes at least one function or operation, which may be implemented in hardware or software, or a combination of hardware and software. Further, as used herein, "connecting" a part with another part may refer to a case where they are "indirectly connected" to each other with other element intervening therebetween, as well as a case where they are directly connected.

Hereinafter, the present disclosure will be described in detail with reference to the accompanying drawings.

FIG. 1 is an exemplary diagram of a vapor cell 100 according to a first embodiment of the present disclosure.

Figure 2:
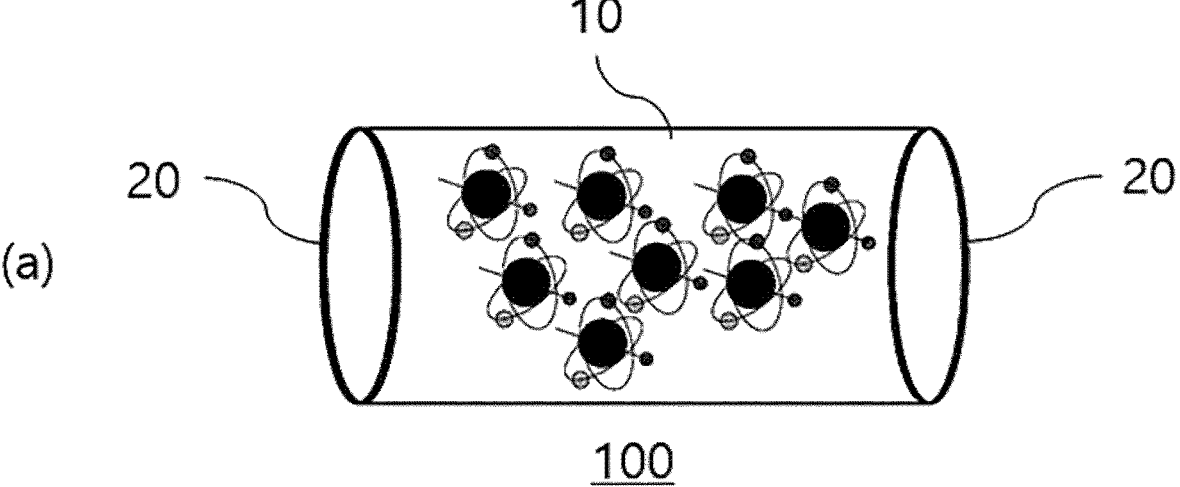
FIG. 2 is another exemplary diagram of a vapor cell according to the present disclosure.
Figure 2:
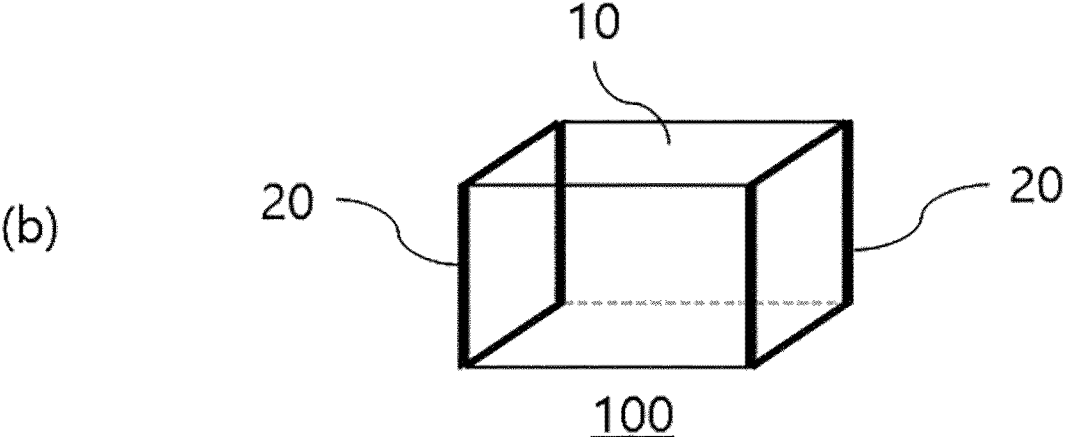

FIG. 2 is another exemplary diagram of a vapor cell 100 according to a first embodiment of the present disclosure.

Referring to FIG. 1, the vapor cell 100 according to a first embodiment of the present disclosure may be configured to include a body 10 and a black material 20.

The body 10 is provided with a penetration part, which is a space in which a reactive material is accommodated.

The reactive material may include an alkali atom such as cesium (Cs) or rubidium (Rb).

The penetration part is a space sealed from the outside, and is a space in which the reactive material can be accommodated. In this regard, the penetration part may accommodate a predetermined buffer gas as well as the reactive material therein to properly constrain the reactive material.

The body 10 may be a 2n (n is an integer of 2 or more) prism or cylinder. That is, it may have a cylindrical shape as shown in FIGS. 1 and 2(*a*) or a square prism shape as shown in FIG. 2(*b*). However, there is no particular restriction on its shape, and it may be implemented in various shapes, such as a sphere or a cube, as long as it can accommodate the reactive material therein.

The black material 20 is provided on a part of the outer surface of the body 10.

The black material 20 may be implemented as a plurality of dots as shown in FIG. 1, or may be implemented in circular ring shapes surrounding opposite ends of the body 10 of the vapor cell 100 as shown in FIG. 2(*a*), or may be implemented in square ring shapes surrounding opposite ends of the body 10 of the vapor cell 100 as shown in FIG. 2(*b*).

If the black material 20 is provided on the entire vapor cell 100 rather than a part thereof, the entire vapor cell 100 is heated by an optical laser, and when lasers (different from the laser for heating the vapor cell 100) used to create Rydberg EIT (Electromagnetically Induced transparency) or to create a magnetometer are irradiated through a window 30, the reactive materials inside the vapor cell 100 are evenly coated on the wall surfaces of the vapor cell 100, making the vapor cell 100 an opaque medium.

This is because the atoms generally used as the reactive material inside the vapor cell 100 are primarily atoms corresponding to Group I, so when the reactive materials gather on the wall surface of the vapor cell 100, they take a metal-like form and reflect light irradiated from the outside.

Therefore, it would be preferable to provide the black material 20 only on the opposite ends of the vapor cell 100 in order to prevent the reactive materials from sticking to the part of the vapor cell 100 through which a specific laser light to be measured (laser light as a measurement object) passes, thereby increasing the transmission of the laser light as a measurement object, and in order to create such a temperature difference that the reactive materials gather around the center of the vapor cell 100.

The black material 20 may be Vanta (Vertically Aligned Nano Tube Array) Black or Carbon Black.

Vanta Black is a material composed of nanotubes and is the most black material 20 that can absorb up to 99.965% of light, and Carbon Black is a material produced from incomplete combustion of carbon-based compounds and refers to black fine carbon powder.

The black material 20 according to the present disclosure is not limited to the above-described examples, and any black material 20 with a high light absorption rate can be applied.

Figure 3:
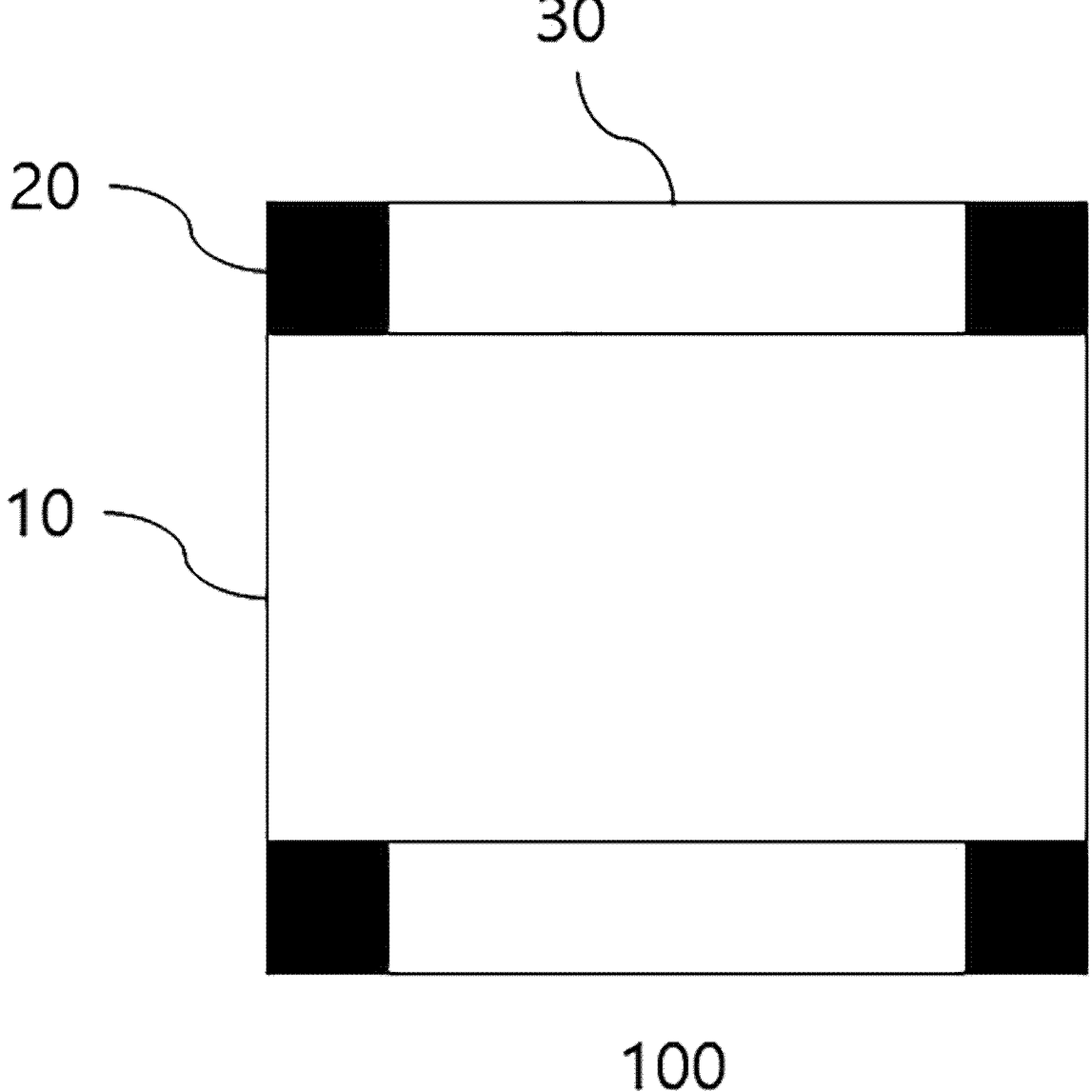
FIG. 3 is a longitudinal cross-sectional view of a vapor cell according to an embodiment of the present disclosure.

FIG. 3 is a longitudinal cross-sectional view of a vapor cell 100 according to a second embodiment of the present disclosure.

Referring to FIG. 3, the vapor cell 100 according to a second embodiment of the present disclosure may be configured to include a body 10 and a window 30.

The body 10 is provided with a penetration part, which is a space in which a reactive material is accommodated.

The window 30 surrounds a part or all of the body 10 with a part of the outer surface coated with a black material 20.

In this regard, it would be preferable that the window 30 is provided with one surface to which a laser light is incident and the other surface opposite to the one surface with the penetration part interposed therebetween for optical pumping of reactive material contained inside the penetration part.

Since the descriptions of the reactive material, penetration part, and black material 20 according to the second embodiment, except for the above explanation, would be the same as the descriptions of the reactive material, penetration part, and black material 20 according to the first embodiment, they will be omitted herein.

Figure 4:
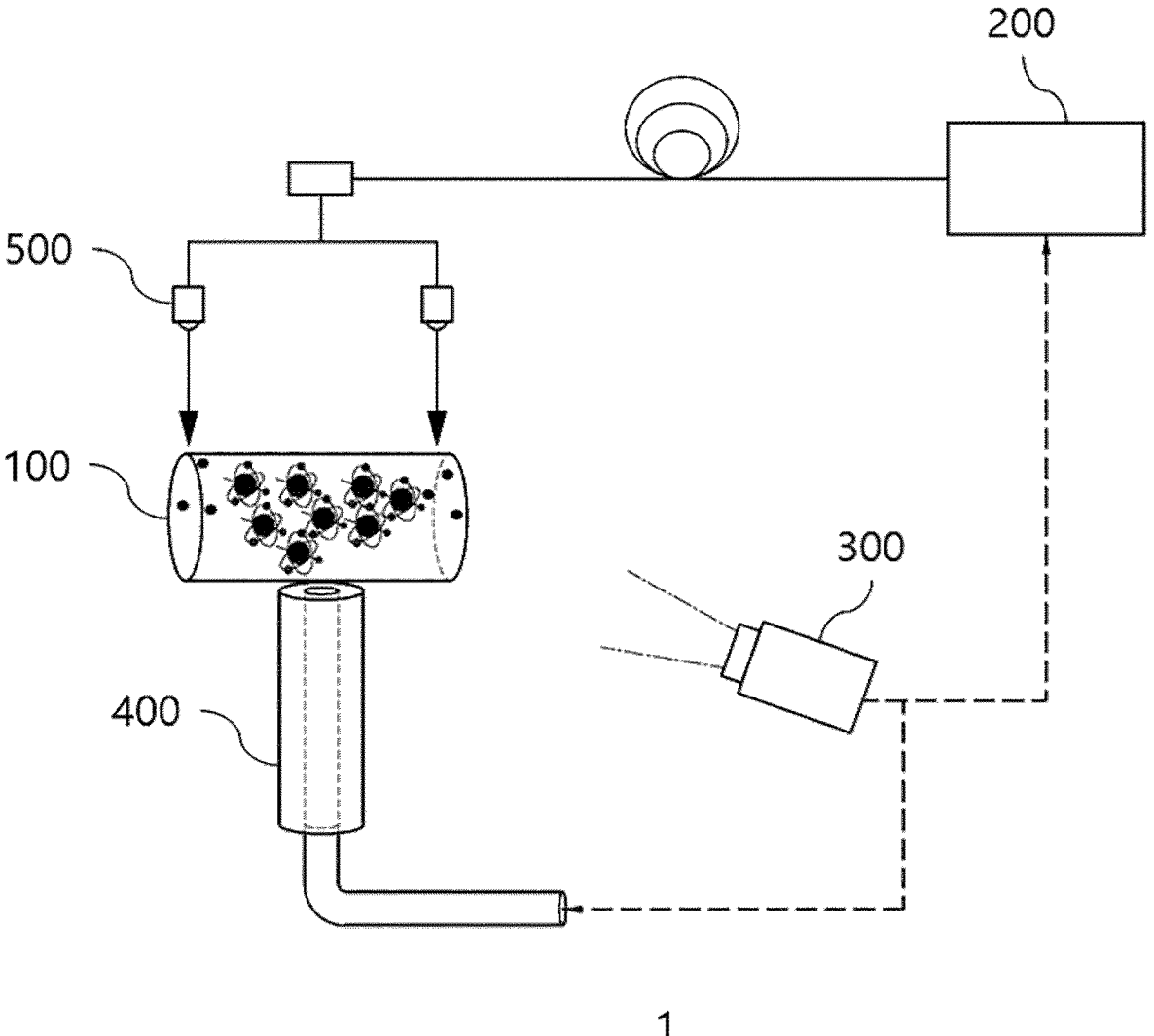
FIG. 4 is a schematic diagram of a vapor cell temperature control system according to an embodiment of the present disclosure.

FIG. 4 is a schematic diagram of a vapor cell 100 temperature control system according to an embodiment of the present disclosure.

Referring to FIG. 4, the vapor cell 100 temperature control system according to an embodiment of the present disclosure may be configured to include the above-described vapor cell 100, a light irradiation part 200, a non-contact thermometer 300, and a control part.

The light irradiation part 200 irradiates laser light to the vapor cell 100. At this time, the laser light irradiated from the light irradiation part 200 is absorbed by the black material 20 included in the vapor cell 100, thereby serving to increase the temperature of the vapor cell 100.

This is to increase the density of reactive materials inside the vapor cell 100 and enlarge the size of the Rydberg EIT spectrum. The larger the size of the Rydberg EIT spectrum, the more likely it is to detect electromagnetic waves of low intensity.

According to an embodiment, the light irradiation part 200 may be constituted with an optical fiber laser, and may further include a branch for branching the optical fiber to focus the light on the parts of the vapor cell 100 coated with the black material 20.

According to an embodiment, the light irradiation part 200 may perform a function of generating laser light and may include a laser generating device, for example, a laser diode such as a VCSEL (Vertical Cavity Surface Emitting Laser) diode.

The non-contact thermometer 300 measures the temperature of the vapor cell 100. That is, the non-contact thermometer 300 measures the temperature of the vapor cell 100 and transmits it to the control part, and preferably, it would be appropriate to use, for example, a thermal imaging camera as the non-contact thermometer 300 to avoid distortion of electromagnetic waves.

However, there is no particular restriction on the thermometer as long as it can measure the temperature of the vapor cell 100 at a far distance from the vapor cell 100. That is, according to an embodiment, an infrared thermometer may be used for measuring the intensity of infrared light emitted from the vapor cell 100.

The control part is configured to be capable of measuring the temperature of the vapor cell 100 with the non-contact thermometer 300, and of providing a feedback to the light irradiation part 200 when the temperature of the vapor cell 100 reaches a preset temperature.

In this regard, the preset temperature may refer to a temperature at which the reactive materials inside the vapor cell 100 reach thermal equilibrium.

According to an embodiment, the control part may be configured to be capable of providing a feedback not only to the light irradiation part 200 but also to a support 400 or a collimator 500.

According to an embodiment, the vapor cell 100 temperature control system may further include the collimator 500 that converts laser light to be incident on the vapor cell 100 into parallel light.

The collimator 500 performs a role of converting light generated at the light irradiation part 200 into parallel light. For example, the collimator 500 can be provided by connecting commonly available collimators 500 to the branches which are branched off from the optical fiber.

According to an embodiment, the vapor cell 100 temperature control system may further include the support 400 that supports the vapor cell 100.

The support 400 may be provided with a hollow passage formed along its longitudinal direction and function as a heat sink.

For example, the opposite ends of the vapor cell 100 are heated by the black material 20 provided at the opposite ends of the vapor cell 100, and the center of the vapor cell 100 loses heat to the hollow passage formed in the longitudinal direction of the support 400 disposed at the bottom center of the vapor cell 100, so that a temperature difference can occur inside the vapor cell 100.

The hollow passage formed along the longitudinal direction of the support 400 minimizes distortion of an electromagnetic wave as a measurement object, which would be caused by the difference in dielectric constant between air and the electromagnetic wave as a measurement object irradiated to the vapor cell 100.

The electromagnetic field measurement method using an atomic system is to measure the magnitude or phase of an electromagnetic wave as a measurement object by measuring the change in the Rydberg EIT spectrum caused by transmitting the electromagnetic wave as a measurement object (for example, communication frequency or the like) to the vapor cell 100 in which an atomic system in the Rydberg EIT state has been formed by irradiating specific lasers to form the atomic system in the Rydberg EIT state after heating the vapor cell 100.

However, the conventional electromagnetic field measurement method using an atomic system heats the vapor cell 100 in a contact manner, causing distortion in an electromagnetic wave as a measurement object.

Contrarily, the vapor cell temperature control system 1 according to the present disclosure raises the temperature of the vapor cell in a non-contact manner by allowing the laser light radiated by the light irradiation part 200 to be absorbed to the black material of the vapor cell 100, so it can avoid the distortion of an electromagnetic wave as a measurement object which would be caused by heating the vapor cell in a contact manner.

The aforementioned description of the present disclosure is just an example, and a person having ordinary skill in the art to which the present disclosure pertains may understand that it can be easily modified into other specific configuration without changing the technical idea or essential features of the present disclosure. Accordingly, it should be understood that the embodiments described above are illustrative and not restrictive in every respect. For example, the respective components described as a singular form may be implemented in a distributed form, and likewise the respective components described as a distributed form may be implemented in a combined form.

The scope of the disclosure is defined by the following claims rather than the detailed description, and all changed or modified forms derived from the meaning and scope of the claims and equivalents thereto should be interpreted as being included in the scope of the disclosure.

The invention claimed is:

1. A vapor cell comprising:
a body provided with a penetration part, which is a sealed space in which a reactive material is accommodated; and
a black material coated on opposite end portions or an entire outer surface of the body;

wherein the black material is configured to absorb laser light irradiated from the outside to increase an internal temperature of the body.

2. A vapor cell comprising:
a body provided with a penetration part, which is a sealed space in which a reactive material is accommodated; and
a window which surrounds a part or all of the body, wherein a part of an outer surface of the window is coated with a black material that is configured to absorb laser light irradiated from the outside to increase an internal temperature of the body.

3. The vapor cell of claim 1, wherein the black material includes Vanta (Vertically Aligned Nano Tube Array) Black or Carbon Black.

4. The vapor cell of claim 1, wherein the body is a prism having 2n surfaces (where n is an integer of 2 or more) or a cylinder.

5. A vapor cell temperature control system comprising:
a vapor cell according to claim 1;
a light irradiation part which irradiates laser light to the vapor cell;
a non-contact thermometer which measures the temperature of the vapor cell; and
a control part configured to be capable of measuring the temperature of the vapor cell with the non-contact thermometer, and of providing a feedback to the light irradiation part when the temperature of the vapor cell reaches a preset temperature.

6. The vapor cell temperature control system of claim 5, further comprising a support which supports the vapor cell.

7. The vapor cell temperature control system of claim 6, wherein the support is provided with a hollow passage formed along its longitudinal direction and functions as a heat sink.

8. The vapor cell temperature control system of claim 5, further comprising a collimator which converts the laser light to be incident on the vapor cell into parallel light.

9. The vapor cell of claim 2, wherein the black material includes Vanta (Vertically Aligned Nano Tube Array) Black or Carbon Black.

10. The vapor cell of claim 2, wherein the body is a prism having 2n surfaces (where n is an integer of 2 or more) or a cylinder.

* * * * *